(12) United States Patent
Shin et al.

(10) Patent No.: US 8,877,634 B2
(45) Date of Patent: Nov. 4, 2014

(54) METHODS OF FORMING A FINE PATTERN ON A SUBSTRATE AND METHODS OF FORMING A SEMICONDUCTOR DEVICE HAVING A FINE PATTERN

(71) Applicant: Samsung Electronics Co., Ltd., Suwon-si (KR)

(72) Inventors: Dong-Woon Shin, Seongnam-si (KR); Bong-Hyun Kim, Incheon (KR); Su-Min Kim, Suwon-si (KR); Hyo-Jung Kim, Gwacheon-si (KR); Chang-Min Park, Hwaseong-si (KR); Soo-Jin Hong, Guri-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/720,170

(22) Filed: Dec. 19, 2012

(65) Prior Publication Data
US 2013/0267092 A1 Oct. 10, 2013

(30) Foreign Application Priority Data

Apr. 5, 2012 (KR) ........................ 10-2012-0035558

(51) Int. Cl.
*H01L 21/4763* (2006.01)
*H01L 21/768* (2006.01)
*H01L 21/308* (2006.01)
*H01L 21/033* (2006.01)
*H01L 27/108* (2006.01)
*H01L 21/311* (2006.01)

(52) U.S. Cl.
CPC ........ *H01L 21/308* (2013.01); *H01L 21/76802* (2013.01); *H01L 21/0337* (2013.01); *H01L 27/10885* (2013.01); *H01L 21/31144* (2013.01); *H01L 27/10888* (2013.01); *H01L 27/10855* (2013.01)

USPC .......... 438/637; 438/622; 438/700; 438/734; 257/E21.038

(58) Field of Classification Search
CPC ................. H01L 21/31; H01L 21/21–21/311; H01L 21/312; H01L 21/31138
USPC ......... 438/622, 624, 637, 694, 700, 702–703, 438/717, 734–737; 257/E21.03, E21.038
See application file for complete search history.

(56) References Cited

U.S. PATENT DOCUMENTS

| 5,968,374 A | 10/1999 | Bullock |
| 2006/0175651 A1* | 8/2006 | Yamamoto et al. ........... 257/308 |

FOREIGN PATENT DOCUMENTS

| JP | 05-190441 | 7/1993 |
| JP | 2902513 | 7/1993 |
| JP | 2004-356572 | 12/2004 |
| JP | 4225836 | 12/2004 |
| JP | 2006-064851 | 3/2006 |
| JP | 2007-264646 | 10/2007 |
| JP | 4440285 | 10/2007 |
| JP | 2008-107788 | 5/2008 |
| JP | 2008-192692 | 8/2008 |
| JP | 2009-069409 | 4/2009 |
| KR | 10-0399061 | 1/2003 |
| KR | 1020030001598 A | 1/2003 |
| KR | 10-0944336 | 7/2007 |

(Continued)

*Primary Examiner* — Thanhha Pham
(74) *Attorney, Agent, or Firm* — Myers Bigel Sibley & Sajovec, PA

(57) ABSTRACT

The inventive concept provides methods of manufacturing semiconductor devices having a fine pattern. In some embodiments, the methods comprise forming an etch-target film on a substrate, forming a first mask pattern on the etch-target film, forming a second mask pattern by performing an ion implantation process in the first mask pattern, and etching the etch-target film using the second mask pattern.

10 Claims, 19 Drawing Sheets

(56) References Cited

FOREIGN PATENT DOCUMENTS

| KR | 1020070075536 A | 7/2007 |
|---|---|---|
| KR | 2008-060309 | 7/2008 |
| KR | 1020080060309 A | 7/2008 |
| KR | 2009-044573 | 5/2009 |
| KR | 1020090044573 A | 5/2009 |
| KR | 2010-038602 | 4/2010 |
| KR | 1020100038602 A | 4/2010 |

* cited by examiner

US 8,877,634 B2

METHODS OF FORMING A FINE PATTERN ON A SUBSTRATE AND METHODS OF FORMING A SEMICONDUCTOR DEVICE HAVING A FINE PATTERN

CROSS-REFERENCE TO RELATED APPLICATION

This application claims priority under 35 U.S.C. §119 to Korean Patent Application No, 10-2012-0035558, filed on Apr. 5, 2012 in the Korean Intellectual Property Office, the disclosure of which is hereby incorporated by reference in its entirety.

FIELD OF THE INVENTION

The inventive concept relates to methods of manufacturing semiconductor devices and, more particularly, to methods of forming a fine pattern of a semiconductor device.

BACKGROUND

As semiconductor devices have become more highly integrated, the integration density of semiconductor devices has progressively increased. Because integration density is limited by the area of the device and the ability to form patterns within that area, there is a need for new methods that are capable of producing finer, more precise patterns than are possible using conventional techniques (e.g., conventional photolithography techniques).

The inventive concept provides methods of forming a fine pattern on a substrate and methods of forming semiconductor devices having a fine pattern.

SUMMARY

Exemplary embodiments of the inventive concept provide methods of forming a fine pattern on a substrate. In some exemplary embodiments, the method comprises, consists essentially of or consists of forming an etch-target film on a substrate; forming a first mask pattern on the etch-target film; implanting ions in the first mask pattern to form a second mask pattern; and etching the etch-target film using the second mask pattern as a mask, thereby forming a fine pattern on the substrate. In some such embodiments, the second aperture is derived from the first aperture by implanting ions in the first mask pattern at a negative or positive angle of incidence with respect to the vertical axis of the substrate.

Exemplary embodiments of the inventive concept provide methods of forming a semiconductor device. In some such embodiments, the method comprises, consists essentially of or consists of forming a first interlayer insulating film on a substrate; forming a first mask pattern on the first interlayer insulating film; implanting ions in the first mask pattern to form a second mask pattern; etching the first interlayer insulating film using the second mask pattern as a mask, thereby forming one or more contact holes in the first interlayer insulating film; and forming one or more contact pads on the substrate, each of said one or more contact pads being formed in one of the one or more contact holes in the first interlayer insulating film. In some such embodiments, the second aperture is derived from the first aperture by implanting ions in the first mask pattern at a negative or positive angle of incidence with respect to the vertical axis of the substrate.

Exemplary embodiments of the inventive concept provide methods of forming a semiconductor device. In some such embodiments, the method comprises, consists essentially of or consists of forming a first interlayer insulating film on a substrate; forming a first mask pattern on the first interlayer insulating film, said first mask pattern comprising a first aperture; implanting ions in the first mask pattern to form a second mask pattern, said second mask pattern comprising a second aperture; etching the first interlayer insulating film using the second mask pattern as a mask, thereby forming a contact hole in the first interlayer insulating film; and forming a contact pad in the contact hole, wherein the diameter of the first aperture is larger than the diameter of the second aperture, wherein the first aperture comprises at least one sidewall that is neither vertical nor substantially vertical, wherein each sidewall of the second aperture is vertical or substantially vertical, and wherein the second aperture is derived from the first aperture. In some such embodiments, the second aperture is derived from the first aperture by implanting ions in the first mask pattern at a negative or positive angle of incidence with respect to the vertical axis of the substrate.

BRIEF DESCRIPTION OF THE DRAWINGS

The foregoing and other aspects, features and advantages of the inventive concept will be apparent from the following detailed description of exemplary embodiments of the inventive concept, as illustrated in the accompanying drawings, in which like reference characters refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1:
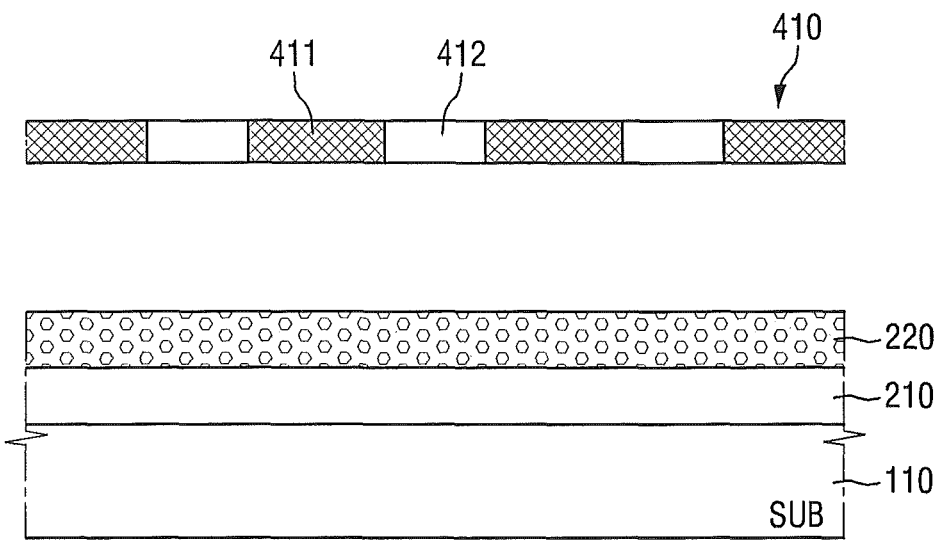
FIGS. 1-4 are cross-sectional views of intermediate structures, illustrating a method of forming a fine pattern according to exemplary embodiments of the inventive concept.

The inventive concept will now be described more fully hereinafter with reference to the accompanying drawings, in which exemplary embodiments of the invention are shown. This inventive concept may, however, be embodied in different forms and should not be construed as limited to the exemplary embodiments set forth herein. Rather, these embodiments are provided so that this disclosure will be thorough and complete, and will fully convey the scope of the inventive concept to those skilled in the art.

Exemplary embodiments of the inventive concepts are described herein with reference to perspective view illustrations, plan view illustrations and/or cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein, but are to include deviations in shapes that result, for example, from manufacturing. For example, an etched region illustrated as a rectangle may, in some embodiments, have rounded or curved features having a predetermined curvature. Thus, the regions illustrated in the drawings are schematic in nature and their shapes are not intended to limit the scope of the inventive concept.

In the drawings, the shapes and relative sizes of respective elements, components, layers, regions and section may be exaggerated for clarity. Like numerals refer to like elements throughout. Names and functions of components not shown or not labeled with reference numerals will easily be understood from other drawings and descriptions contained herein.

The terminology used herein is for the purpose of describing exemplary embodiments of the inventive concept and is not intended to be limiting of the inventive concept.

Unless otherwise defined, all terms used herein (including technical and scientific terms) have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms "first," "second," "third," etc. may be used herein to describe various elements, components, regions, layers and/or sections, such elements, components, regions, layers and/or sections are not limited by those terms. Unless the context clearly indicates otherwise indicated, the terms are used only to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the terms "a" and "an" and "the" and similar referents in the context of describing the inventive concept (especially in the context of the following claims) are to be construed to cover both the singular and the plural forms, unless otherwise indicated herein or clearly contradicted by context.

As used herein, the terms "comprise," "comprising," "have," "having," "include," "including," "contain," "containing" and grammatical variants thereof specify the presence of stated features, integers, steps, operations, elements, components, regions, layers and/or sections, but do not preclude the presence or addition of one or more other features, integers, steps, operations, elements, components, regions, layers, sections and/or groups thereof.

As used herein, the term "substantially vertical" means that the longitudinal axis of the referenced item (e.g., an aperture sidewall) is substantially aligned with the vertical axis of the substrate upon which the referenced item is formed. In some exemplary embodiments, a referenced item is deemed to be substantially vertical if the orientation of its longitudinal axis differs from the vertical axis of the substrate by no more than about $0.1°$, $0.25°$, $0.5°$, $1°$, $1.5°$, $2°$, $2.5°$, $3°$, $4°$, $5°$. In some exemplary embodiments, a referenced item is deemed to be substantially vertical if the orientation of its longitudinal axis differs from the vertical axis of the substrate by about $0.1°$, $0.25°$, $0.5°$, $1°$, $1.5°$, $2°$, $2.5°$, $3°$, $4°$, $5°$. In some exemplary embodiments, a referenced item is deemed to be substantially vertical if the orientation of its longitudinal axis differs from the vertical axis of the substrate by less than $0.1°$, $0.25°$, $0.5°$, $1°$, $1.5°$, $2°$, $2.5°$, $3°$, $4°$ or $5°$.

Hereinafter, exemplary embodiments of the inventive concept will be explained in detail with reference to the accompanying drawings.

Methods of forming a fine pattern according to exemplary embodiments of the inventive concept will be described with reference to FIGS. 1-9.

As shown in FIGS. 1-9, in some exemplary embodiments of the inventive concept, an etch-target film 210 is formed on a substrate 110.

Any suitable etch-target film 210 may be formed. In some exemplary embodiments, the etch-target film 210 comprises a conductive film. In some exemplary embodiments, the etch-target film 210 comprises an insulating film.

The etch-target film 210 may be formed on any suitable substrate 110, including, but not limited to, a substrate comprising silicon. In some exemplary embodiments, the substrate 110 is a silicon substrate, a silicon-on-insulator (SOI) substrate, a gallium arsenide substrate, a silicon germanium substrate, or a flexible substrate such as plastic.

The etch-target film 210 may be formed using any suitable method, including, but not limited to, chemical vapor deposition (CVD), physical vapor deposition (PVD), atomic layer deposition (ALD) and sputtering.

Figure 2:
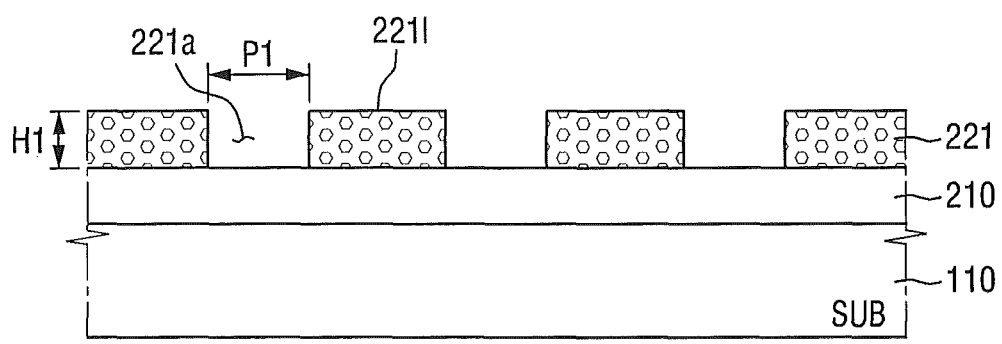

As shown in FIGS. 1-2, in some exemplary embodiments of the inventive concept, a first mask pattern 221 is formed on the etch-target film 210.

In some exemplary embodiments, the first mask pattern 221 is formed by selectively removing portions of the photosensitive film 220.

Any suitable first mask pattern 221 may be formed, including, but not limited to, first mask patterns 221 comprising, consisting essentially of or consisting of a photosensitive material (e.g., a positive photosensitive film or a negative photosensitive film). In some exemplary embodiments, the first mask pattern 221 comprises, consists essentially of or consists of a photoresist.

The first mask pattern 221 may comprise any suitable pattern, including, but not limited to, patterns comprising a plurality of lines and/or plurality of apertures. In some exemplary embodiments, the first mask pattern 221 comprises, consists essentially of or consists of a plurality of lines 2211 separated from each other by a first pitch P1. In some exemplary embodiments, the first mask pattern 221 comprises, consists essentially of or consists of one or more apertures 221a having a diameter equal to a first pitch P1 (see, e.g., FIG. 2 and FIG. 4). In some exemplary embodiments, the first mask pattern 221 comprises at least one pitch (e.g., P1) that exceeds one or more of the pitches in a subsequent mask pattern (e.g., a second pitch P2 of a second mask pattern 222). The first mask pattern 221 may comprise a first height H1.

Any suitable method may be used to form the first mask pattern 221, including, but not limited to, conventional photolithography techniques. In some exemplary embodiments, the first mask pattern 221 is formed by forming a photosensitive film 220 (e.g., a positive photosensitive film or a negative photosensitive film) on the etch-target film 210 and removing portions of the photosensitive film 220. For example, as shown in FIG. 1, in some exemplary embodiments of the inventive concept, a photomask 410 is placed above the photosensitive film 220 and used to selectively remove portions of the photosensitive film 220 by selectively exposing/shielding portions of the photosensitive film 220 from light. In some such embodiments, the photomask 410 includes one or more light-transmitting regions 412 and one or more light-blocking regions 411, wherein each light-transmitting region 412 allows light to pass therethrough and wherein each light-blocking region 411 blocks the passage of light therethrough. The photomask 410 may be placed such that each light-blocking region 411 overlays a portion of the photosensitive film 220 in which a line is to be formed and/or such that each light-transmitting region 412 overlays a region of the photosensitive film 220 in which an aperture is to be formed. Upon exposure to light, portions of the photosensitive film 220 underlying the light-transmitting region(s) 412 of the photomask 410 may be removed. Portions of the photosensitive film 220 underlying the light-blocking region(s) 411 of the photomask 410 may remain intact. Accordingly, a first mask pattern 221 may be formed on the etch-target film 210.

Figure 3:
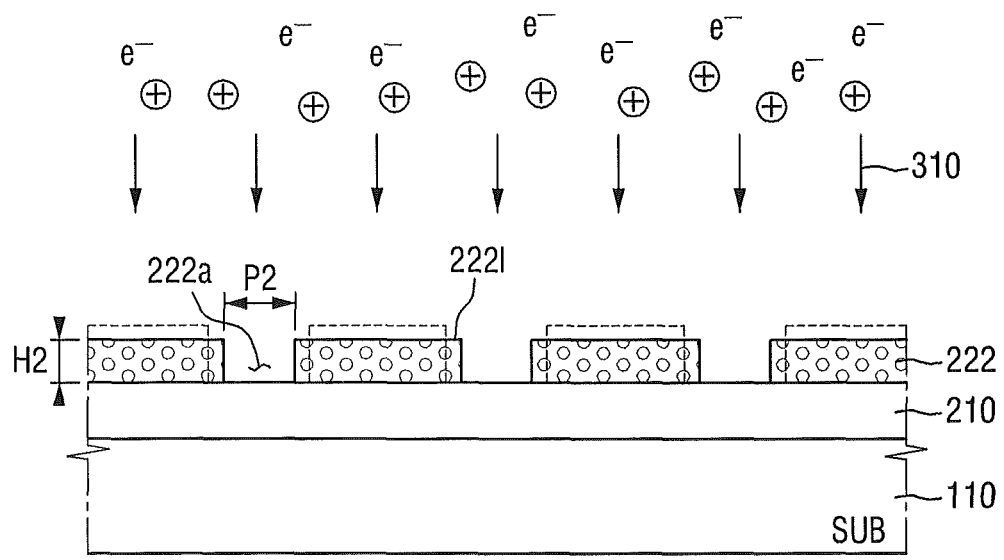

As shown in FIG. 3, in some exemplary embodiments of the inventive concept, a second mask pattern 222 is formed on the etch-target film 210 by implanting one or more ions in the first mask pattern 221.

The second mask pattern 222 may comprise any suitable pattern, including, but not limited to, patterns comprising a plurality of lines and/or a plurality of apertures. In some exemplary embodiments, the second mask pattern 222 comprises, consists essentially of or consists of a plurality of lines 2221 separated from each other by a second pitch P2. In some exemplary embodiments, the second mask pattern 222 comprises, consists essentially of or consists of one or more apertures 222a having a diameter equal to a second pitch P2 (see, e.g., FIG. 2 and FIG. 5). In some exemplary embodiments, the second mask pattern 222 comprises at least one pitch (e.g., P2) that is smaller than one or more of the pitches in a previous mask pattern (e.g., first pitch P1 of the first mask pattern 221). The second mask pattern 222 may comprise a second height H2.

Any suitable dose of ions may be implanted into the first mask pattern 221. In some exemplary embodiments, ions are implanted in the first mask pattern 221 in a dose ranging from about $1 \times 10^{14}$ to about $5 \times 10^{17}$ per square centimeter. Those skilled in the art will understand how to determine the appropriate ion implantation dosage for a given mask pattern.

Ions may be implanted in the first mask pattern 221 to any suitable depth, including, but not limited to, a depth that is equal to about 1%, 2%, 3%, 4%, 5%, 6%, 7%, 8%, 9%, 10%, 11%, 12%, 13%, 14%, 15%, 16%, 17%, 18%, 19%, 20%, 25%, 30%, 35%, 40%, 45%, 50%, 55%, 65%, 70%, 75%. 80%, 85%, 90%, 95% or 100% the depth of the first mask pattern 221. Those skilled in the art will understand how to determine the appropriate ion implantation depth for a given mask pattern.

Ions may be implanted in the first mask pattern 221 any suitable angle, including, but not limited to, −89°, −88°, −87°, −86°, −85°, −84°, −83°, −82°, −81°, −80°, −79°, −78°, −77°, −76°, −75°, −74°, −73°, −72°, −71°, −70°, −69°, −68°, −67°, −66°, −65°, −64°, −63°, −62°, −61°, −60°, −59°, −58°, −57°, −56°, −55°, −54°, −53°, −52°, −51°, −50°, −49°, −48°, −47°, −46°, −45°, −44°, −43°, −42°, −41°, −40°, −39°, −38°, −37°, −36°, −35°, −34°, −33°, −32°, −31°, −30°, −29°, −28°, −27°, −26°, −25°, −24°, −23°, −22°, −21°, −20°, −19°, −18°, −1'7°, −16°, −15°, −14°, −13°, −12°, −11°, −10°, −9°, −8°, −7°, −6°, −5°, −40°, −30°, −20°, −1°, 0°, 1°, 2°, 3°, 4°, 5°, 6°, 7°, 8°, 9°, 10°, 1°, 12°, 13°, 14°, 15°, 16°, 17°, 18°, 19°, 20°, 21°, 22°, 23°, 24°, 25°, 26°, 27°, 28°, 29°, 30°, 31°, 32°, 33°, 34°, 35°, 36°, 37°, 38°, 39°, 40°, 41°, 42°, 43°, 44°, 45°, 46°, 47°, 48°, 49°, 50°, 51°, 52°, 53°, 54°, 550, 56°, 57°, 58°, 59°, 60°, 61°, 62°, 63°, 64°, 65°, 66°, 67°, 68°, 69°, 70°, 71°, 72°, 73°, 74°, 75°, 76°, 77°, 78°, 790, 80°, 81°, 82°, 83°, 84°, 85°, 86°, 87°, 88°, 89° with respect to the vertical axis of the substrate. Those skilled in the art will understand how to determine the appropriate ion implantation angle for a given mask pattern.

Ions may be implanted in the first mask pattern 221 in any suitable pattern, including, but not limited to, a three-dimensional pattern. Those skilled in the art will understand how to determine the appropriate ion implantation pattern for a given mask pattern.

Ions may be implanted in the first mask pattern 221 at any suitable speed. Those skilled in the art will understand how to determine the appropriate ion implantation speed for a given mask pattern.

Any suitable ion implantation process 310 may be used to form the second mask pattern 222, including, but not limited to, conventional ion implantation techniques. In some exemplary embodiments, the ion implantation process 310 comprises, consists essentially of or consists of a plasma ion implantation process. In some exemplary embodiments, the ion implantation process 310 comprises, consists essentially of or consists of a beamline ion implantation process In some exemplary embodiments, the ion implantation process 310 comprises a source gas comprising one or more of the following gases: argon (Ar), arsenic (As), boron (B), carbon (C), fluorine (F), germanium (Ge), helium (He), neon (Ne), nitrogen (N), phosphorus (P), silicon (Si) and xenon (Xe). In some exemplary embodiments, the ion implantation process 310 comprises applying a bias of about 0 to about 10 kV to the substrate 110. In some exemplary embodiments, the ion implantation process 310 comprises cooling the substrate 110 and/or preventing the temperature of the substrate 110 from substantially increasing during the ion implantation process 310. In some exemplary embodiments, the ion implantation process 310 comprises heating the substrate 310 during the ion implantation process 310. In some such embodiments, heating the substrate In some exemplary embodiments, the ion implantation process 310 comprise 310 increases the effectiveness of the ion implantation process 310 and/or facilitates the formation of a desired mask pattern.

For example, in some exemplary embodiments, the ion implantation process 310 comprises, consists essentially of or consists of a plasma ion implantation process, wherein the second mask pattern 222 is formed by contacting the first mask pattern 221 with plasma ions. In some such embodiments, the plasma ion implantation process comprises, consists essentially of or consists of inducing an ionizing a source gas to form plasma and contacting the first mask pattern 221 with said plasma. The source gas may be ionized using any suitable method, including, but not limited to, colliding source gas molecules with accelerated electrons (e.g., electrons accelerated by an electric filed induced by a magnetic field generated by a radio frequency (RF) current flowing through the antenna of an ion implanter). A high-voltage pulse may be applied to the substrate 110 to increase the incidence of plasma ions contacting the first mask pattern 221. One or more incident ions (e.g., incident ions with high kinetic energy) may penetrate the surface of the first mask pattern 221, thereby becoming implanted in the first mask pattern 221.

Ions implanted in the first mask pattern 221 may break (or otherwise transform) existing bonds and/or may generate new bonds. As bonds are broken, transformed and/or formed, heat may be generated such that the temperature of the first mask pattern is substantially increased. In some exemplary embodiments, the heat generated by the breaking, transforming and/or forming of bonds gives rise to one or more structural changes in the first mask pattern 221 (e.g., the first mask pattern 221 may expand, contract, soften, harden, etc.). Such changes may occur sequentially (e.g., the first mask pattern 221 may horizontally expand and/or vertically shrink prior to hardening) or concurrently (e.g., the first mask pattern 221 may horizontally expand and/or vertically shrink and harden at substantially the same time). In some exemplary embodiments, the first mask pattern 221 expands in a horizontal direction but contracts in a vertical direction (i.e., becomes wider and shorter). Thus, the second mask pattern 222 may comprise lines and/or apertures with different structural dimensions than the first mask pattern 221 from which it was derived. For example, the second mask pattern 222 may comprise a plurality of second apertures whose diameter(s) is/are smaller than the diameter(s) of the corresponding apertures in the first mask pattern 221 from which the second mask pattern 222 was derived (e.g., a second mask pattern 222 comprising a plurality of second apertures 222a having a diameter equal to a second pitch P2 may be derived from a first mask pattern 221 comprising a plurality of first apertures 221a having a diameter equal to a first pitch P1, wherein the first apertures 221a are transformed into the second apertures 222a using an ion implantation process 310). Likewise, the second mask pattern 222 may have a second height H2 that is shorter than the height H1 of the first mask pattern 221.

The sidewalls of lines/apertures in the second mask pattern 222 may have any suitable orientation, including, but not limited to, vertical or substantially vertical. Thus, in some exemplary embodiments, the sidewalls of the lines/apertures on the second mask patter 222 are perpendicular or substantially perpendicular to the surface of the substrate 110. In some exemplary embodiments, the second mask pattern 222 comprises one or more lines/apertures having vertical sidewalls (as shown in FIG. 3). In some exemplary embodiments, the second mask pattern 222 comprises one or more lines/apertures having angled sidewalls (i.e., sidewalls with an orientation lying somewhere between the horizontal and vertical axes of the substrate). In some such embodiments depicted herein, lines/apertures having a profile that tilts to the right of the vertical axis of the substrate 110 are referred to as having a positive profile, whereas lines/apertures having a profile that tilts to the left of the vertical axis of the substrate 110 are referred to as having a negative profile.

Any suitable method may be used to form lines/apertures having the desired sidewall orientation, including, but not limited to, selectively adjusting the depth of ion implantation in the first mask pattern 221 and selectively adjusting the angle of incidence with which ions are implanted in the first mask pattern 221.

The orientation of the line/aperture sidewalls of the second mask pattern 222 may be controlled by selectively adjusting the depth of ion implantation in the first mask pattern 221. For example, uniform ion implantation throughout the depth of a first mask pattern 221 having vertical sidewalls may facilitate the formation of vertical sidewalls by promoting uniform horizontal expansion throughout the depth of the first mask pattern 221. Likewise, differential ion implantation throughout the depth of a first mask pattern 221 having vertical sidewalls (e.g., an implantation gradient wherein the concentration of ions in the upper surface of the first mask pattern 221 is high and negligible in the lower surface of the first mask pattern 221) may facilitate the formation of angled sidewalls by promoting different levels of horizontal expansion throughout the depth of the first mask pattern 221.

Figure 4:
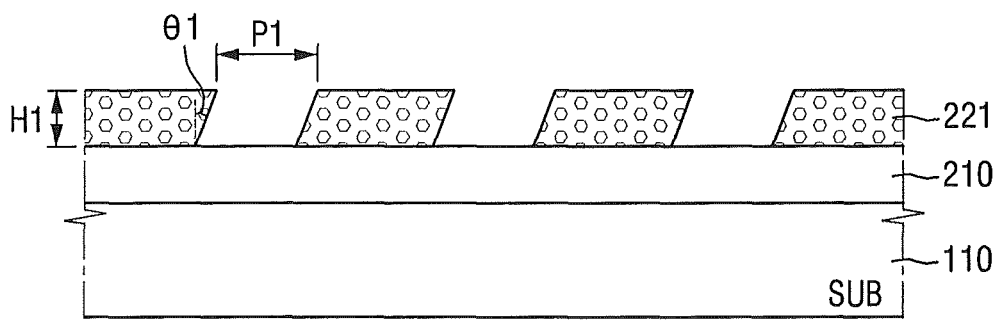
Figure 5:
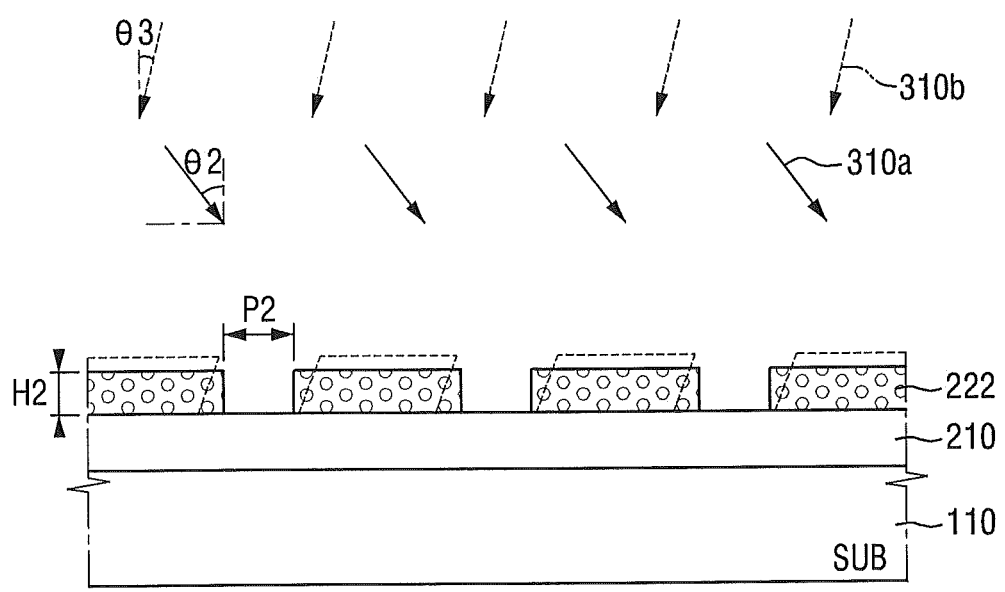
FIGS. 5-6 are cross-sectional views of intermediate structures, illustrating a method of forming a fine pattern according to exemplary embodiments of the inventive concept.

As shown in FIGS. 4-5, in some exemplary embodiments of the inventive concept, the orientation of the line/aperture sidewalls of the second mask pattern 222 may be controlled by selectively adjusting the angle of incidence with which ions are implanted in the first mask pattern 221 during the ion implantation process 310. For example, the first mask pattern 221 may comprise a plurality of lines 2211 separated from each other by a first pitch P1 and/or a plurality of apertures 221a having diameter equal to a first pitch P1, wherein the sidewalls of the lines/apertures are oriented at a positive angle θ1 with respect to the vertical axis of the substrate 110, and the orientation of the line/aperture sidewalls may be adjusted by implanting ions in the first mask pattern 221 at a negative angle of incidence with respect to the vertical axis of the substrate 110, thereby forming a second mask pattern 222 having a plurality of lines/apertures with vertical or substantially vertical sidewalls. Likewise, line/aperture sidewalls having a negative profile may be made vertical or substantially vertical by implanting ions in the first mask pattern 221 at a positive angle of incidence with respect to the vertical axis of the substrate 110.

Figure 6:
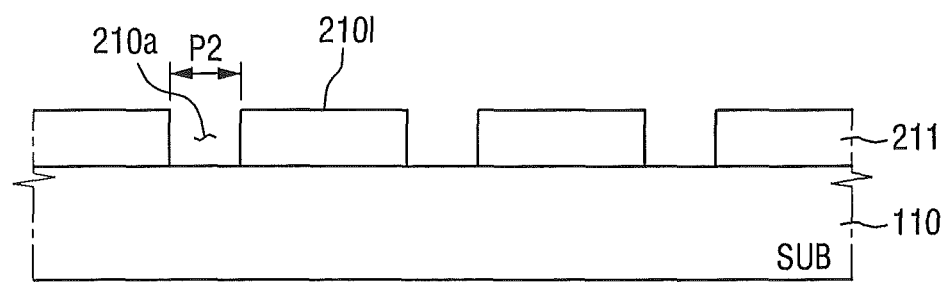

If the sidewalls of the lines/apertures do not have the desired orientation following a single ion implantation process, one or more additional ion implantation processes may be utilized to further modulate the angle of the line/aperture sidewalls. For example, as shown in FIGS. 5-6, a first mask pattern 221 having line/aperture sidewalls oriented at positive angle θ1 may be converted to a second mask pattern 222 having vertical or substantially vertical line/aperture sidewalls by a first ion implantation process 310a performed at first negative angle of incidence θ2 with respect to the vertical axis of the substrate 110, and a second ion implantation process 310b performed at a second negative angle of incidence θ3 with respect to the vertical axis of the substrate 110.

Those skilled in the art will understand how to determine the appropriate ion implantation angle(s) to adjust the orientation of a line/aperture having a given angle.

As noted above with respect to FIG. 5, in some exemplary embodiments of the inventive concept, ions are repeatedly implanted in the first mask pattern 221 to produce a second mask pattern 222 having the desired structural characteristics (e.g., a plurality of apertures having a desired diameter and vertical or substantially vertical sidewalls). Thus, in some exemplary embodiments, forming the second mask pattern 211 may comprise sequential ion implantation processes and one or more intermediate mask patterns.

The second mask pattern 222 may be used as a mask to selectively remove portions of the etch-target film 210.

As shown in FIG. 6, in some exemplary embodiments of the inventive concept, one or more contact holes 210a is formed in the etch-target film 210 using the second mask pattern 222 as a mask. In some such embodiments, the diameter of each contact holes 210a is substantially equal to the diameter of the corresponding aperture 222a in the second mask pattern 222 (e.g., equal to P2).

Any suitable method may be used to form the contact hole(s) 210a in the etch-target film 210, including, but not limited to, conventional etching techniques. In some exemplary embodiments, the etch-target film 210 is etched using a wet-etching technique. In some exemplary embodiments, the etch-target film 210 is etched using a dry-etching technique.

The contact hole 210a may be of any suitable depth. In some exemplary embodiments, one or more of the contact holes 210a exposes the substrate 110 (as shown in FIG. 6). In some exemplary embodiments, no portion of the substrate 110 is exposed by the contact holes 210a.

The second mask pattern 222 may be removed concurrently with and/or subsequent to formation of the contact holes 210a.

Thus, in some exemplary embodiments of the inventive concept, a method of forming a fine pattern on a substrate comprises, consists essentially of or consists of: forming an etch-target film 210 on a substrate 110; forming a photosensitive film 220 on the etch-target film 210; forming a first mask pattern 221 on the etch-target film 210 by selectively removing a portion of the photosensitive film 220; forming a second mask pattern 222 on the etch-target film 210 by implanting one or more ions in the first mask pattern 221; and forming a plurality of contact holes 210a in the etch-target film 210 by etching the etch-target film 210 using the second mask pattern 220 as a mask, thereby forming a fine pattern in the etch-target film 210. In some such embodiments, ions are implanted in the first mask pattern 221 using a plasma ion implantation process, optionally a plasma ion implantation process comprising a source gas that comprises one or more gases selected from the group consisting of Ar, As, B, C, F, Ge, He, Ne, N, P, Si and Xe. In some such embodiments, the second mask pattern 222 comprises a plurality of apertures, each with a diameter that is smaller than the corresponding aperture of the first mask pattern 221 from which the second mask pattern 222 was formed. In some such embodiments, the orientation of the aperture sidewalls in the second mask pattern 222 is selectively controlled by adjusting the angle of incidence with which ions are implanted in the first masked pattern 220. In some such embodiments, the sidewalls of the apertures in the second mask pattern 222 are vertical or substantially vertical. In some such embodiments, the sidewalls of the contact holes 210a in the etch-target film 210 are vertical or substantially vertical.

Figure 7:
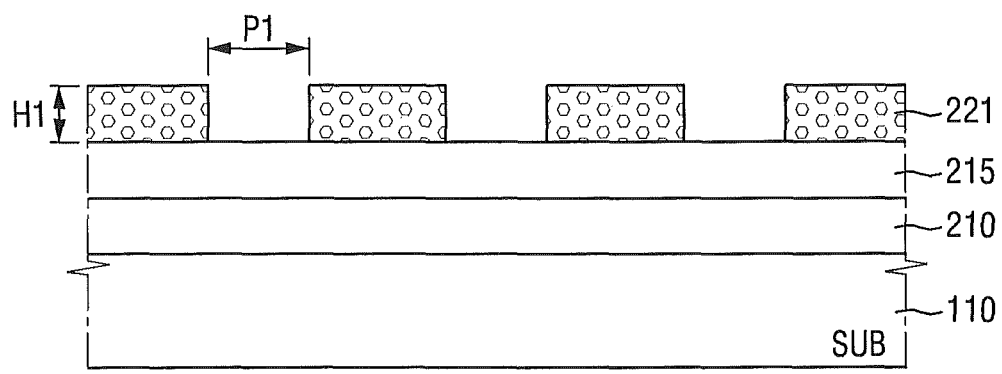
FIGS. 7-9 are cross-sectional views of intermediate structures, illustrating a method of forming a fine pattern according to exemplary embodiments of the inventive concept.
Figure 8:
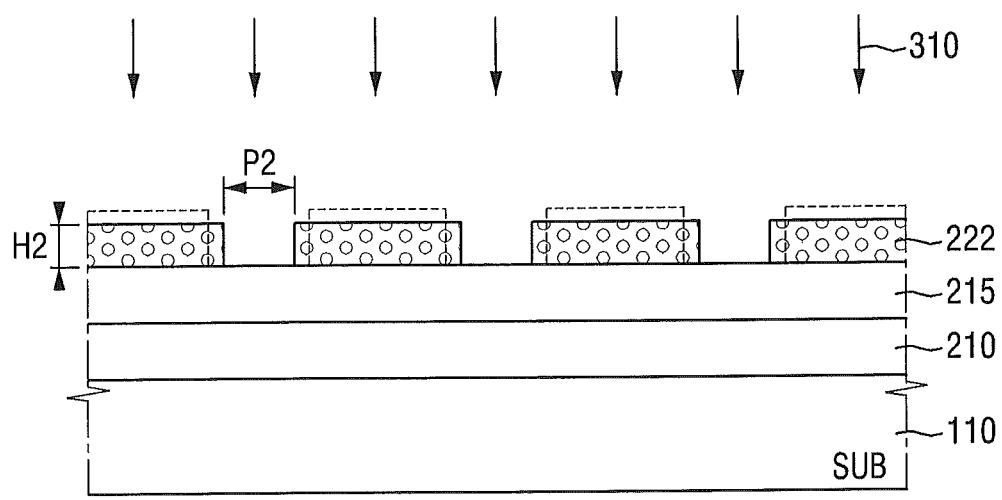
Figure 9:
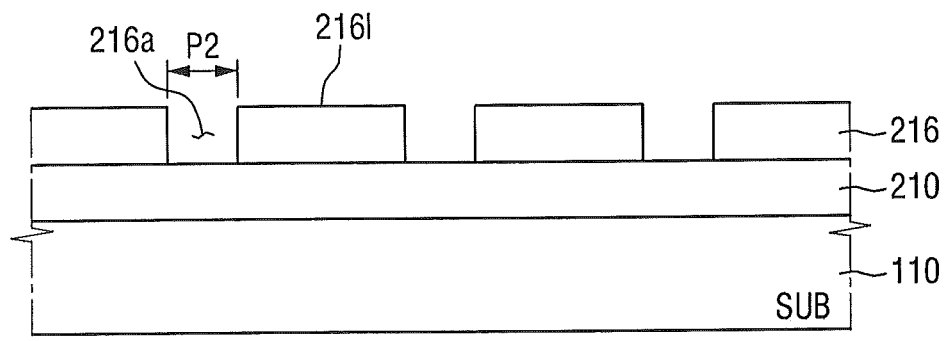

As shown in FIGS. 7-9, in some exemplary embodiments of the inventive concept, a hard mask film 215 is formed on the etch-target film 210 prior to formation of the first mask pattern 221.

Any suitable hard mask film 215 may be formed, including, but not limited to, hard mask films comprising oxides and/or nitrides. In some exemplary embodiments, the hard mask film 215 comprises at least one oxide film (e.g., an oxide film comprising a thermal oxide film, a CVD oxide film, an undoped silicate glass film and/or a high-density plasma (HDP) film). In some exemplary embodiments, the hard mask film 215 comprises at least one nitride film (e.g., a nitride film comprising SiON, SiN, SiBN and/or BN). In some exemplary embodiments, the hard mask film 215 comprises on or more oxide films in combination with one or more nitride films (e.g., an oxide film stacked upon a nitride film). Those skilled in the art will understand how to determine which film(s) is/are appropriate for use in the hard mask film 215.

As one skilled in the art will understand, the make-up of the hard mask film 215 may be selectively adjusted to provide one or more advantages with respect to the etching of the etch-target film 210. For example, the constituents of the hard mask film 215 may be selectively adjusted to provide etch sensitivity with respect to an etch-target film 210 comprising an insulating film or a conductive film. Likewise, the constituents of the hard mask film 215 may be selectively adjusted to account for the particular constituents of the etch-target film 210. Those skilled in the art will understand how to determine which constituents are appropriate for use with a given etch-target film 210.

The hard mask film 215 may be formed using any suitable method, including, but not limited to, CVD, PVD, ALD and sputtering.

As shown in FIG. 7, a first mask pattern 221 may be formed on the hard mask film 215 as described above with respect to the formation of a first mask pattern 221 on an etch-target film 210. Thus, in some exemplary embodiments, the first mask pattern 221 is formed by first forming a photosensitive film 220 on the hard mask film 215 and then selectively removing portions of the photosensitive film 220 (e.g., by using a photomask 410 as described above). In some exemplary embodiments, the first mask pattern 221 comprises, consists essentially of or consists of a photoresist.

As shown in FIG. 8, a second mask pattern 222 may be formed on the hard mask film 215 as described above with respect to the formation of a second mask pattern 222 on an etch-target film 210. Thus, in some exemplary embodiments, the second mask pattern 222 is formed on the hard mask film 215 by implanting ions in a first mask pattern 221 (e.g., by using a plasma ion implantation process as described above).

As shown in FIG. 9, in some exemplary embodiments of the inventive concept, a hard mask pattern 216 is formed by etching the hard mask film 215 using the second mask pattern 222 as a mask. In some such embodiments, the diameter of each aperture 216a in the hard mask pattern 216 is substantially equal to the diameter of the corresponding aperture 222a in the second mask pattern 222 (e.g., equal to P2).

Any suitable method may be used to etch the hard mask film 215, including, but not limited to, conventional etching techniques. In some exemplary embodiments, the hard mask film 215 is etched using a wet-etching technique. In some exemplary embodiments, the hard mask film 215 is etched using a dry-etching technique.

The hard mask pattern 216 may be used as a mask to selectively remove portions of the etch-target film 210. In some exemplary embodiments, one or more contact holes 210a is formed using the hard mask pattern 216 as a mask as described above with respect to the formation of contact holes 210a using the second mask pattern 222 as a mask.

Thus, in some exemplary embodiments of the inventive concept, a method of forming a fine pattern on a substrate comprises, consists essentially of or consists of: forming an etch-target film 210 on a substrate 110; forming a hard mask film 215 on the etch-target film 215; forming a photosensitive film 220 on the hard mask film 215; forming a first mask pattern 221 on the hard mask film 215 by selectively removing a portion of the photosensitive film 220; forming a second mask pattern 222 on the hard mask film 215 by implanting one or more ions in the first mask pattern 221; forming a hard mask pattern 216 on the etch-target film by etching the hard mask film 215 using the second mask pattern 222 as a mask; and forming a plurality of contact holes 210a in the etch-target film 210 by etching the etch-target film 210 using the hard mask film 215 as a mask, thereby forming a fine pattern in the etch-target film 210. In some such embodiments, ions are implanted in the first mask pattern 221 using a plasma ion implantation process, optionally a plasma ion implantation process comprising a source gas that comprises one or more gases selected from the group comprising Ar, As, B, C, F, Ge, He, Ne, N, P, Si and Xe. In some such embodiments, the second mask pattern 222 comprises a plurality of apertures, each with a diameter that is smaller than the corresponding aperture of the first mask pattern 221 from which the second mask pattern 222 was formed. In some such embodiments, the orientation of the aperture sidewalls in the second mask pattern 222 is selectively controlled by adjusting the angle of incidence with which ions are implanted in the first masked pattern 220. In some such embodiments, the sidewalls of the apertures in the second mask pattern 222 are vertical or substantially vertical. In some such embodiments, the hard mask film 215 comprises at least one oxide film and/or at least one nitride film. In some such embodiments, the sidewalls of the hard mask pattern 216 are vertical or substantially vertical. In some such embodiments, the sidewalls of the contact holes 210a in the etch-target film 210 are vertical or substantially vertical.

As will be appreciated by those skilled in the art, the aforementioned methods may be used to form fine patterns (e.g., a fine pattern on a semiconductor substrate). Indeed, methods of the inventive concept allow for the formation of patterns that are finer and/or more precise than patterns formed by preexisting methods. As such, methods of the inventive concept may facilitate the formation of semiconductor devices having increased integration density as compared to semiconductor devices formed in accordance with preexisting methods.

Methods of manufacturing a semiconductor device according to exemplary embodiments of the inventive concept will be described with reference to FIGS. 10-25. Although the following exemplary embodiments are described with respect to a dynamic random access memory (DRAM) device, one skilled in the art will appreciate that the inventive concept may be applied to any suitable semiconductor device, including, but not limited to, other memory devices (e.g., nonvolatile memory devices).

Figure 10:
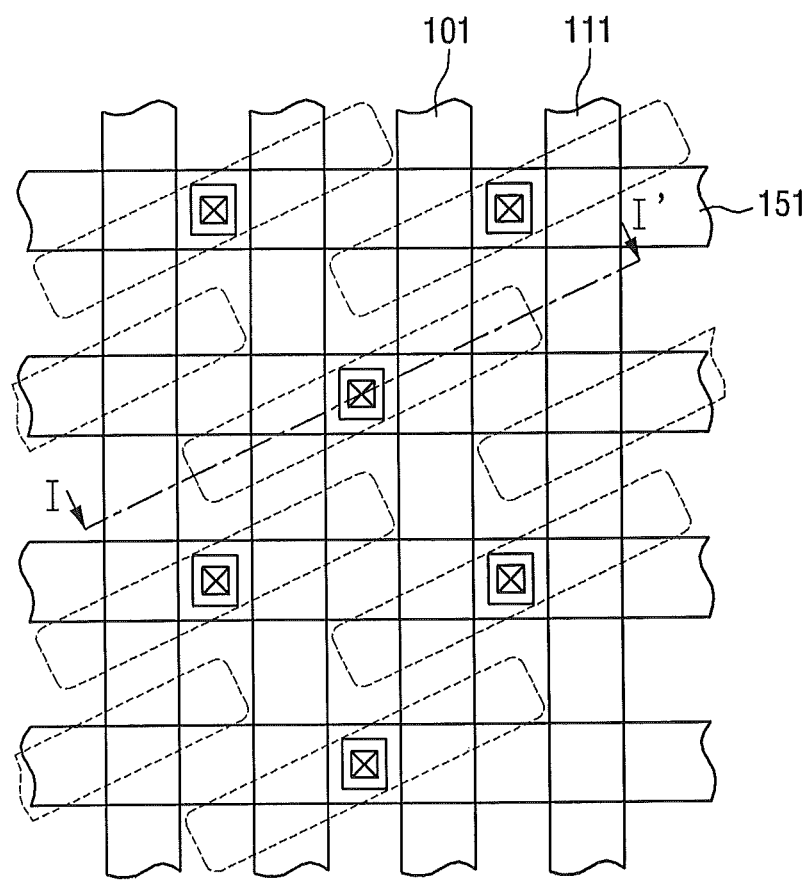
FIG. 10 is a schematic layout diagram of a semiconductor device according to exemplary embodiments of the inventive concept.

FIG. 10 is a schematic layout diagram of a semiconductor device according to exemplary embodiments of the inventive concept. As shown therein, in some exemplary embodiments, methods of the inventive concept may be utilized to manufacture a semiconductor device having a plurality of gate lines 101, a plurality of active regions 111 and a plurality of bit lines 151.

Cross-sectional views taken along the line I-I' of FIG. 10 are described hereinafter with respect to FIGS. 11-25.

Figure 11:
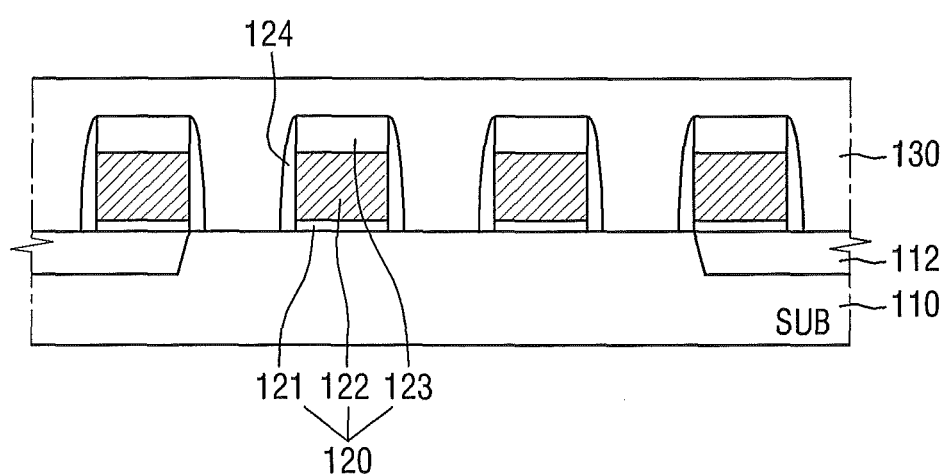
FIGS. 11-25 are cross-sectional views taken along the line I-I' of FIG. 10, which illustrate a method of manufacturing a semiconductor device according to exemplary embodiments of the inventive concept.

As shown in FIG. 11, in some exemplary embodiments of the inventive concept, a plurality device isolation layers 112 is formed on a substrate 110.

Any suitable device isolation layer 112 may be formed, including, but not limited to, device isolation layers 112 comprising oxidized silicon. In some exemplary embodiments, the device isolation layer 112 comprises a field oxide (FOX) film (e.g., a FOX film formed by local oxidation of silicon). In some exemplary embodiments, the device isolation layer 112 comprises a shallow trench isolation (STI) film (e.g., an STI film formed by local oxidation of silicon).

The device isolation layers 112 may be formed on any suitable substrate 110, including, but not limited to, a substrate comprising silicon. In some exemplary embodiments, the substrate 110 is a silicon substrate, a silicon-on-insulator (SOI) substrate, a gallium arsenide substrate, a silicon germanium substrate, or a flexible substrate such as plastic.

The device isolation layers 112 may define one or more active regions 111.

As shown in FIG. 11, in some exemplary embodiments of the inventive concept, a plurality of gate lines 101 is formed on the substrate 110.

Any suitable gate line 101 may be formed on the substrate 110. In some exemplary embodiments, one or more of the gate lines 101 comprises a gate pattern 120, which may itself comprise a gate insulating film 121, a gate electrode 122 and a gate capping film 123 stacked sequentially. In some exemplary embodiments, the gate pattern 120 comprises a gate spacer 124, which may be formed on the sidewalls of the gate pattern 120 (as shown in FIGS. 11-25).

Although not shown in the drawings, in some exemplary embodiments of the inventive concept, impurities may be implanted in the substrate 110 using the gate lines 101 as a mask. In some such embodiments, ion implantation in the substrate 110 forms source/drain regions in the substrate 110.

As shown in FIG. 11, in some exemplary embodiments of the inventive concept, a first interlayer insulating film 13Q is formed on the substrate 110. In some such embodiments, the first interlayer insulating film 130 covers the gate lines 101.

Any suitable first interlayer insulating film 130 may be formed, including, but not limited to, first interlayer insulating films 130 comprising one or more oxides. In some exemplary embodiments, the first interlayer insulating film 130 comprises at least one oxide film (e.g., an oxide film comprising a borophosphosilicate glass (BPSG) film, a plasma-enhanced tetraethyl orthosilicate (PE-TEOS) film and/or an HDP film).

As one skilled in the art will understand, the first interlayer insulating film 130 may have a different etch selectivity from that of the gate spacer 124.

The first interlayer insulating film 130 may be formed using any suitable method, including, but not limited to, CVD, PVD, ALD and sputtering.

Figure 12:
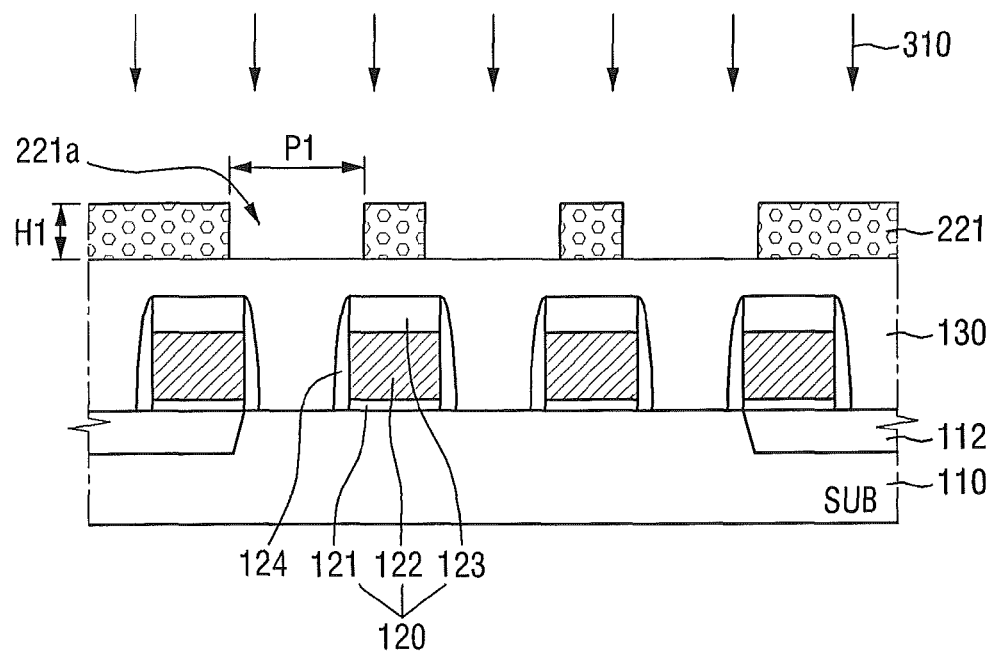

As shown in FIG. 12, a first mask pattern 221 may be formed on the first interlayer insulating film 130 as described above with respect to the formation of a first mask pattern 221 on an etch-target film 210 or a hard mask film 215. Thus, in some exemplary embodiments, the first mask pattern 221 is formed by first forming a photosensitive film 220 on the first interlayer insulating film 130 and then selectively removing portions of the photosensitive film 220 (e.g., by using a photomask 410 as described above). In some exemplary embodiments, the first mask pattern 221 comprises, consists essentially of or consists of a photoresist.

Figure 13:
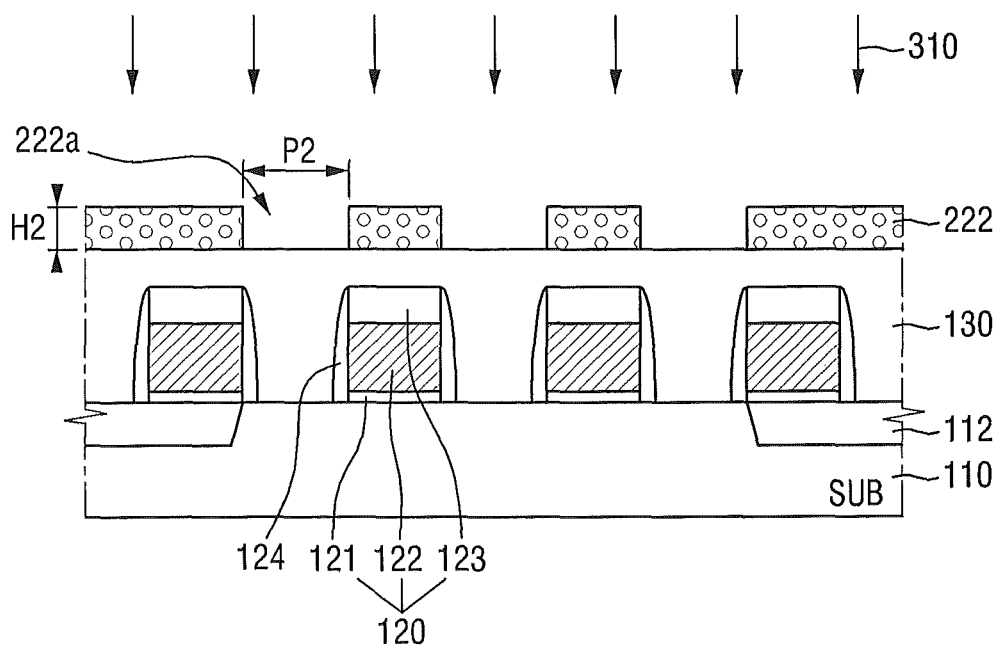

As shown in FIG. 13, a second mask pattern 222 may be formed on the first interlayer insulating film 130 as described above with respect to the formation of a second mask pattern 222 on an etch-target film 210 or a hard mask film 215. Thus, in some exemplary embodiments, the second mask pattern 222 is formed on the first interlayer insulating film 130 by implanting ions in a first mask pattern 221 (e.g., by using a plasma ion implantation process as described above).

The second mask pattern 222 may be used as a mask to selectively remove portions of the first interlayer insulating film 130.

Figure 14:
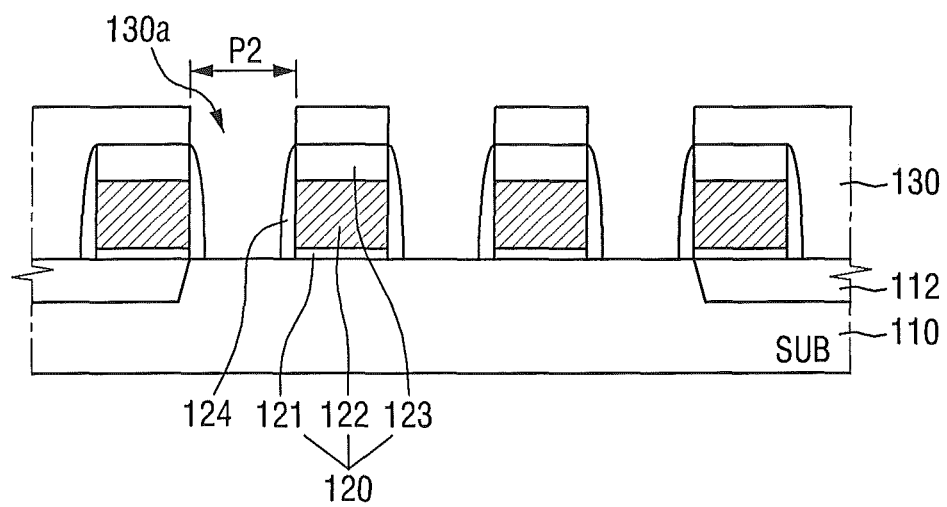

As shown in FIG. 14, in some exemplary embodiments of the inventive concept, one or more contact holes 130a is formed in the first interlayer insulating film 130 using the second mask pattern 222 as a mask. In some such embodiments, the diameter of each contact hole 130a is substantially equal to the diameter of the corresponding aperture in the second mask pattern 222 (e.g., equal to P2).

Any suitable method may be used to form the contact hole(s) 130a in the first interlayer insulating film 130, including, but not limited to, conventional etching techniques. In some exemplary embodiments, the first interlayer insulating film 130 is etched using a wet-etching technique. In some exemplary embodiments, the first interlayer insulating film 130 is etched using a dry-etching technique.

The contact hole(s) 130a may be of any suitable depth. In some exemplary embodiments, one or more of the contact holes 130a exposes the substrate 110 (as shown in FIG. 14). In some exemplary embodiments, no portion of the substrate 110 is exposed by the contact holes 130a.

The second mask pattern 222 may be removed concurrently with and/or subsequent to formation of the contact holes 130a.

Figure 15:
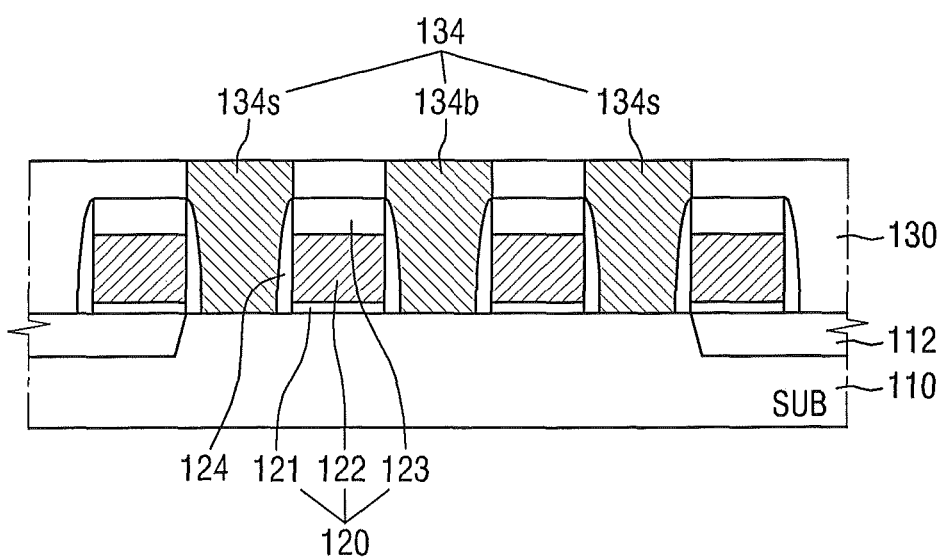

As shown in FIG. 15, in some exemplary embodiments of the inventive concept, one or more contact pads 134 are formed on the substrate 110. In some exemplary embodiments, a contact pad 134 is formed in each of the contact holes 130a.

Any suitable contact pad 134 may be formed on the substrate 110. In some exemplary embodiments, one or more of the contact pads 134 comprises a conductive film. In some exemplary embodiments, the contact pads 134 comprise one or more bit line contacts pads 134b and/or one or more storage electrode contact pads 134s.

Any suitable method may be used to form the contact pads 134, including, but not limited to, conventional contact-forming techniques. In some exemplary embodiments, contact pads 134 are formed by first covering the substrate 110 with a conductive film such that the conductive film fills the contact holes 130a and covers at least a portion of the upper surface of the first interlayer insulating film 130 and then removing the conductive film from the upper surface of the first interlayer insulating film 130 (e.g., by an etch-back process and/or a chemical/mechanical polishing process).

Figure 16:
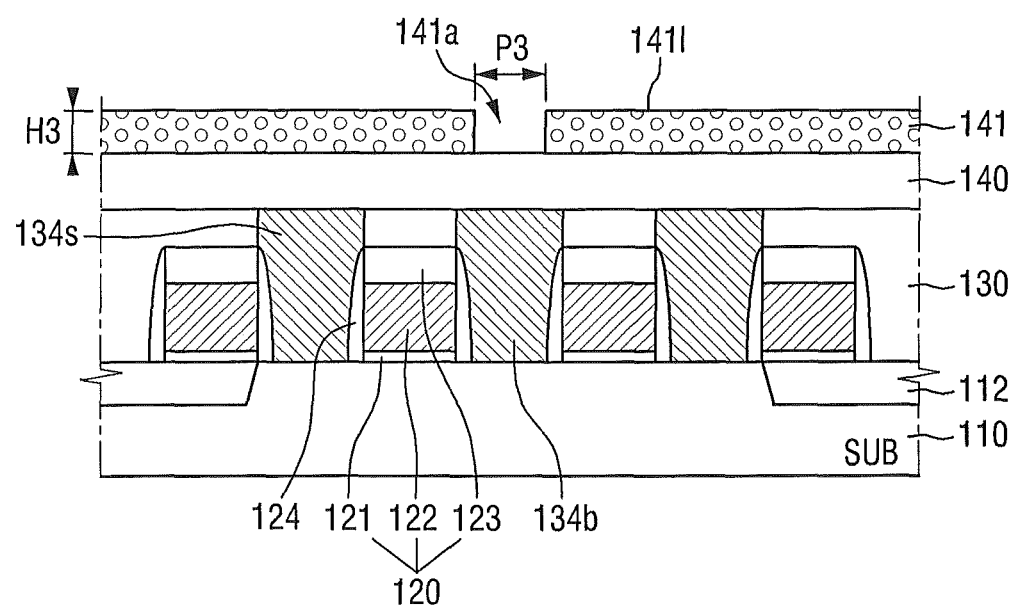

As shown in FIG. 16, in some exemplary embodiments of the inventive concept, a second interlayer insulating layer 140 is formed on the first interlayer insulating layer 130.

Any suitable second interlayer insulating film 140 may be formed, including, but not limited to, second interlayer insulating films 140 comprising one or more oxides. In some exemplary embodiments, the second interlayer insulating film 140 comprises at least one oxide film (e.g., an oxide film comprising a borophosphosilicate glass (BPSG) film, a plasma-enhanced tetraethyl orthosilicate (PE-TEOS) film and/or an HDP film).

As one skilled in the art will understand, the second interlayer insulating film 140 may have a different etch selectivity from that of the contact pads 134.

The second interlayer insulating film 140 may be formed using any suitable method, including, but not limited to, CVD, PVD, ALD and sputtering.

As shown in FIG. 16, a third mask pattern 141 may be formed on the second interlayer insulating film 140 as described above with respect to the formation of a first mask pattern 221 on an etch-target film 210, a hard mask film 215 or the first interlayer insulating film 130. Thus, in some exemplary embodiments, the third mask pattern 141 is formed by first forming a photosensitive film 220 on the second interlayer insulating film 140 and then selectively removing portions of the photosensitive film 220 (e.g., by using a photomask 410 as described above). In some exemplary embodiments, the third mask pattern 141 comprises, consists essentially of or consists of a photoresist.

The third mask pattern 141 may comprise any suitable pattern, including, but not limited to, patterns comprising a plurality of lines and/or plurality of apertures. In some exemplary embodiments, the third mask pattern 141 comprises, consists essentially of or consists of a plurality of lines 1411 separated from each other by a third pitch P3. In some exemplary embodiments, the third mask pattern 141 comprises, consists essentially of or consists of one or more apertures 141a having a diameter equal to a third pitch P3 (see, e.g., FIG. 16). In some exemplary embodiments, the third mask pattern 141 comprises at least one pitch (e.g., P3) that exceeds one or more of the pitches in a subsequent mask pattern (e.g., a fourth pitch P4 of a fourth mask pattern 142). The third mask pattern 141 may comprise a third height H3.

Figure 17:
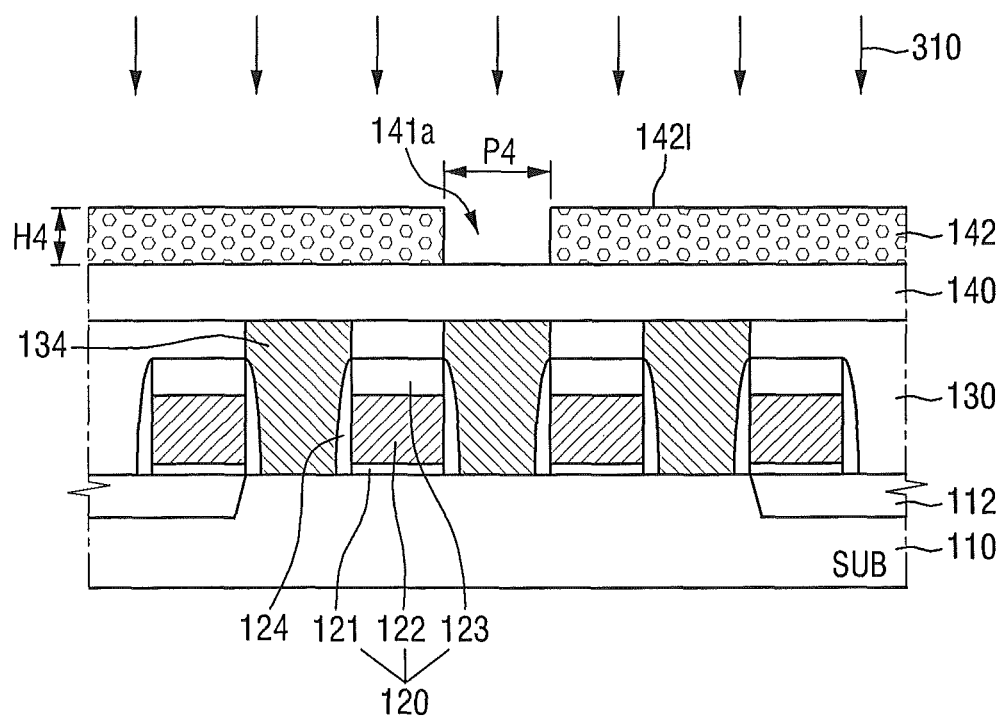

As shown in FIG. 17, a fourth mask pattern 142 may be formed on the second interlayer insulating film 140 as described above with respect to the formation of a second mask pattern 220 on an etch-target film 210, a hard mask film 215 or the first interlayer insulating film 130. Thus, in some exemplary embodiments, the fourth mask pattern 142 is formed on the second interlayer insulating film 140 by implanting ions in a third mask pattern 141 (e.g., by using a plasma ion implantation process as described above).

The fourth mask pattern 142 may comprise any suitable pattern, including, but not limited to, patterns comprising a plurality of lines and/or a plurality of apertures. In some exemplary embodiments, the fourth mask pattern 142 comprises, consists essentially of or consists of a plurality of lines 1421 separated from each other by a fourth pitch P4. In some exemplary embodiments, the fourth mask pattern 142 comprises, consists essentially of or consists of one or more apertures 142a having a diameter equal to a fourth pitch P4 (see, e.g., FIG. 17). In some exemplary embodiments, the fourth mask pattern 142 comprises at least one pitch (e.g., P4) that is smaller than one or more of the pitches in a previous mask pattern (e.g., third pitch P3 of the third mask pattern 141). The fourth mask pattern 142 may comprise a fourth height H4.

The fourth mask pattern 142 may be used as a mask to selectively remove portions of the second interlayer insulating film 140.

Figure 18:
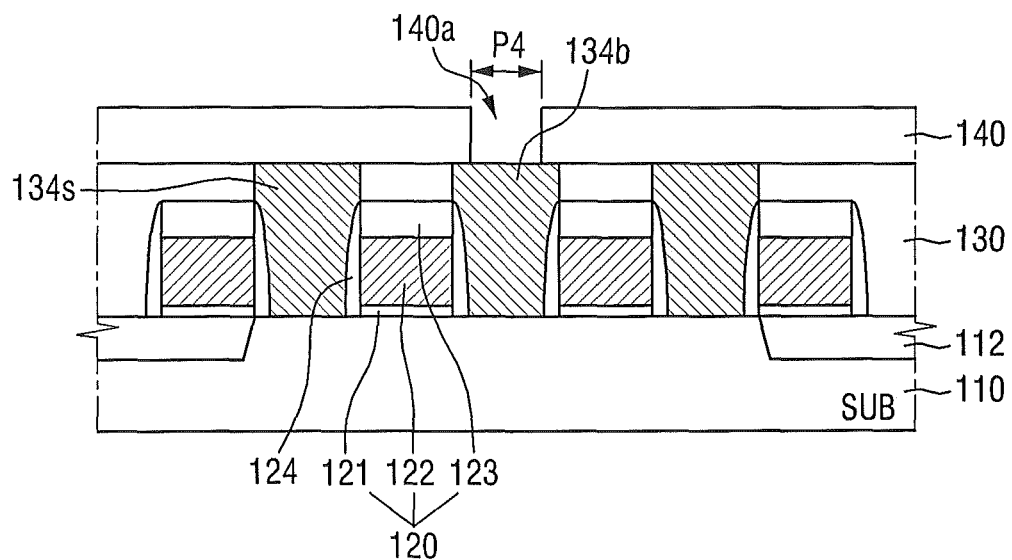

As shown in FIG. 18, in some exemplary embodiments of the inventive concept, one or more bit line contact holes 140a is formed in the second interlayer insulating film 140 using the fourth mask pattern 142 as a mask. In some such embodiments, the diameter of each bit line contact hole 140a is substantially equal to the diameter of the corresponding aperture 142a in the fourth mask pattern 142 (e.g., equal to P4).

Any suitable method may be used to form the bit line contact holes 140a in the second interlayer insulating film 140, including, but not limited to, conventional etching techniques. In some exemplary embodiments, the second interlayer insulating film 140 is etched using a wet-etching technique. In some exemplary embodiments, the second interlayer insulating film 140 is etched using a dry-etching technique.

The bit line contact holes 140a may be of any suitable depth. In some exemplary embodiments, one or more of the bit line contact holes 140a exposes a bit line contact pad (as shown in FIG. 18).

The fourth mask pattern 142 may be removed concurrently with and/or subsequent to formation of the bit line contact holes 140a.

Figure 19:
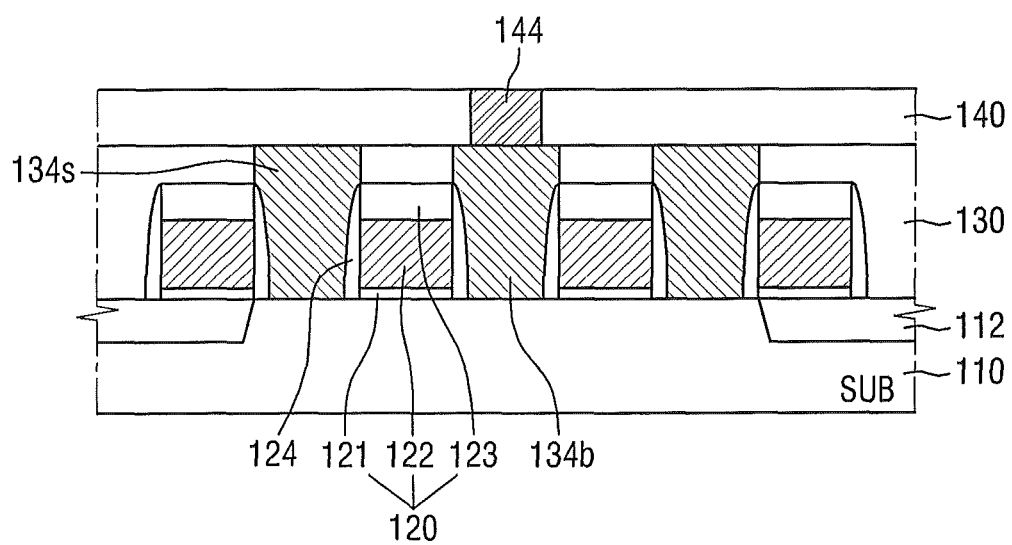

As shown in FIG. 19, in some exemplary embodiments of the inventive concept, one or more bit line contacts 144 are formed on the substrate 110. In some exemplary embodiments, a bit line contact 144 is formed in each of the bit line contact holes 140a.

Any suitable bit line contact 144 may be formed on the substrate 110. In some exemplary embodiments, one or more of the bit line contacts 144 comprises a conductive film.

Any suitable method may be used to form the bit line contact(s) 144. In some exemplary embodiments, bit line contacts 144 are formed by first covering the substrate 110 with a conductive film such that the conductive film fills the bit line contact hole(s) 140a and covers at least a portion of the upper surface of the second interlayer insulating film 140 and then removing the conductive film from the upper surface of the second interlayer insulating film 140 (e.g., by an etch-back process and/or a chemical/mechanical polishing process).

Figure 20:
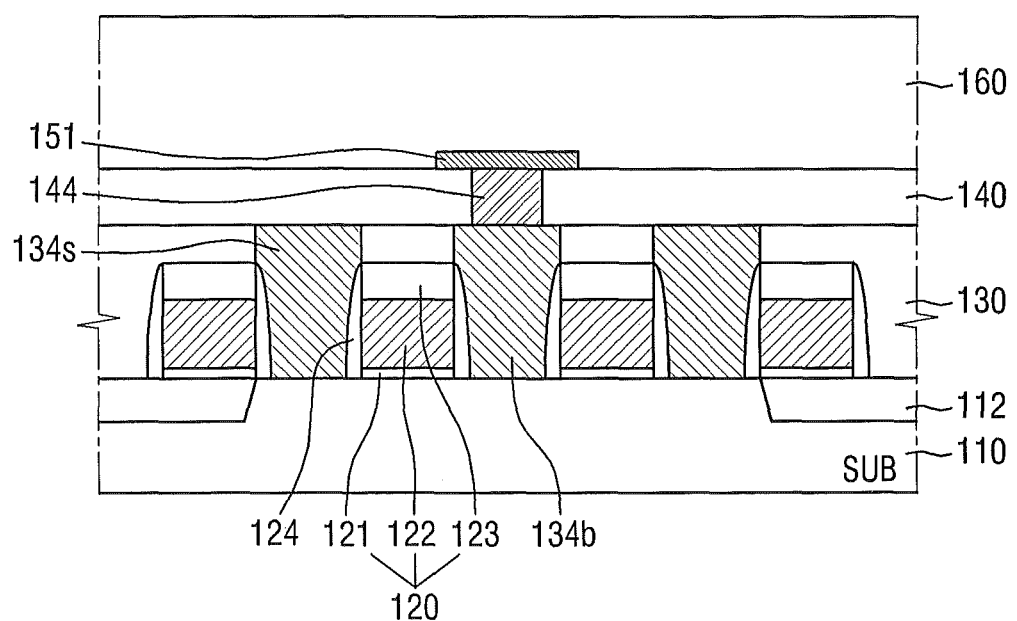

As shown in FIG. 20, in some exemplary embodiments of the inventive concept, one or more bit lines 151 is formed on the substrate 110. In some exemplary embodiments, a bit line 151 is formed adjacent to each of the bit line contacts 144. Thus, in some exemplary embodiments of the inventive concept, the bit lines 151 are connected to the bit line contact pads 134b via the bit line contacts 144.

Any suitable bit line 151 may be formed on the substrate 110, including, but not limited to, bit lines 151 comprising N-type polysilicon, metal silicide, tungsten (W), titanium (Ti) and/or N. In some exemplary embodiments, one or more of the bit lines 151 comprises a sequential stack of N-type polysilicon and metal silicide. In some exemplary embodiments, one or more of the bit lines 151 comprises a sequential stack of W and TiN.

Although not shown in drawings, in some exemplary embodiments of the inventive concept, a bit line capping film and/or a bit line spacer is formed on a bit line 151. In some exemplary embodiments, a bit line capping film is stacked on each bit line 151. In some exemplary embodiments, a bit line spacer is formed on the sidewalls of each bit line 151.

Any suitable method may be used to form the bit line(s) 151.

Bit lines 151 may be formed on the substrate 110 in any suitable configuration. In some exemplary embodiments, a plurality of bit lines 151 is formed on the substrate 110 such that the longitudinal axis of each bit line 151 extends in direction that is perpendicular to the longitudinal axis of the gate line(s) 101 on the substrate 110 (as shown in FIG. 10).

As shown in FIG. 20, in some exemplary embodiments of the inventive concept, a third interlayer insulating film 160 is formed on the substrate 110. In some exemplary embodiments, the third interlayer insulating film 160 covers each bit line 151 and at least a portion of the second interlayer insulating film 140 (e.g., the entirety of the second interlayer insulating film 140, including that portion of the second interlayer insulating film 140 underlying the bit line(s) 151).

Any suitable third interlayer insulating film 160 may be formed, including, but not limited to, third interlayer insulating films 160 comprising one or more oxides. In some exemplary embodiments, the third interlayer insulating film 160 comprises at least one oxide film (e.g., an oxide film comprising a BPSG film, a PE-TEOS film and/or an HDP film).

As one skilled in the art will understand, the third interlayer insulating film 160 may have a different etch selectivity from that of the first interlayer insulating film 130, storage electrode contact pad(s) 134s, second interlayer insulating film 140 and/or bit line(s) 151.

The third interlayer insulating film 160 may be formed using any suitable method, including, but not limited to, CVD, PVD, ALD and sputtering.

Figure 21:
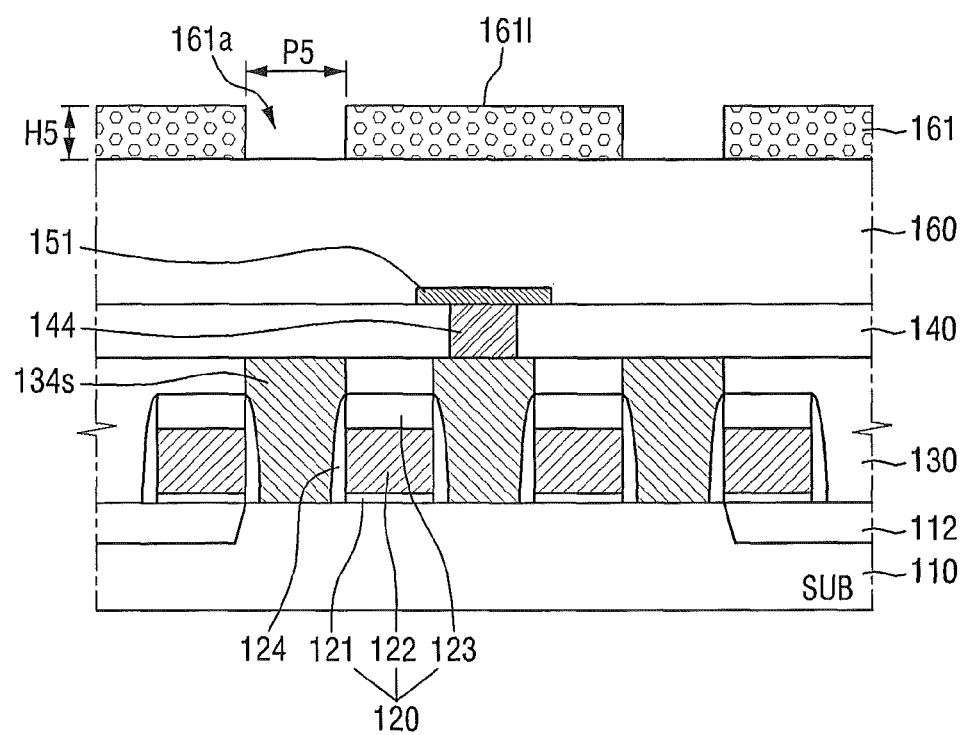

As shown in FIG. 21, a fifth mask pattern 161 may be formed on the third interlayer insulating film 160 as described above with respect to the formation of a first mask pattern 221 on an etch-target film 210, a hard mask film 215 or the first interlayer insulating film 130. Thus, in some exemplary embodiments, the fifth mask pattern 161 is formed by first forming a photosensitive film 220 on the third interlayer insulating film 160 and then selectively removing portions of the photosensitive film 220 (e.g., by using a photomask 410 as described above). In some exemplary embodiments, the fifth mask pattern 161 comprises, consists essentially of or consists of a photoresist.

The fifth mask pattern 161 may comprise any suitable pattern, including, but not limited to, patterns comprising a plurality of lines and/or plurality of apertures. In some exemplary embodiments, the fifth mask pattern 161 comprises, consists essentially of or consists of a plurality of lines 1611 separated from each other by a fifth pitch P5. In some exemplary embodiments, the fifth mask pattern 161 comprises, consists essentially of or consists of one or more apertures 161a having a diameter equal to a fifth pitch P5 (see, e.g., FIG. 21). In some exemplary embodiments, the fifth mask pattern 161 comprises at least one pitch (e.g., P5) that exceeds one or more of the pitches in a subsequent mask pattern (e.g., a sixth pitch P6 of a sixth mask pattern 162). The fifth mask pattern 161 may comprise a fifth height H5.

Figure 22:
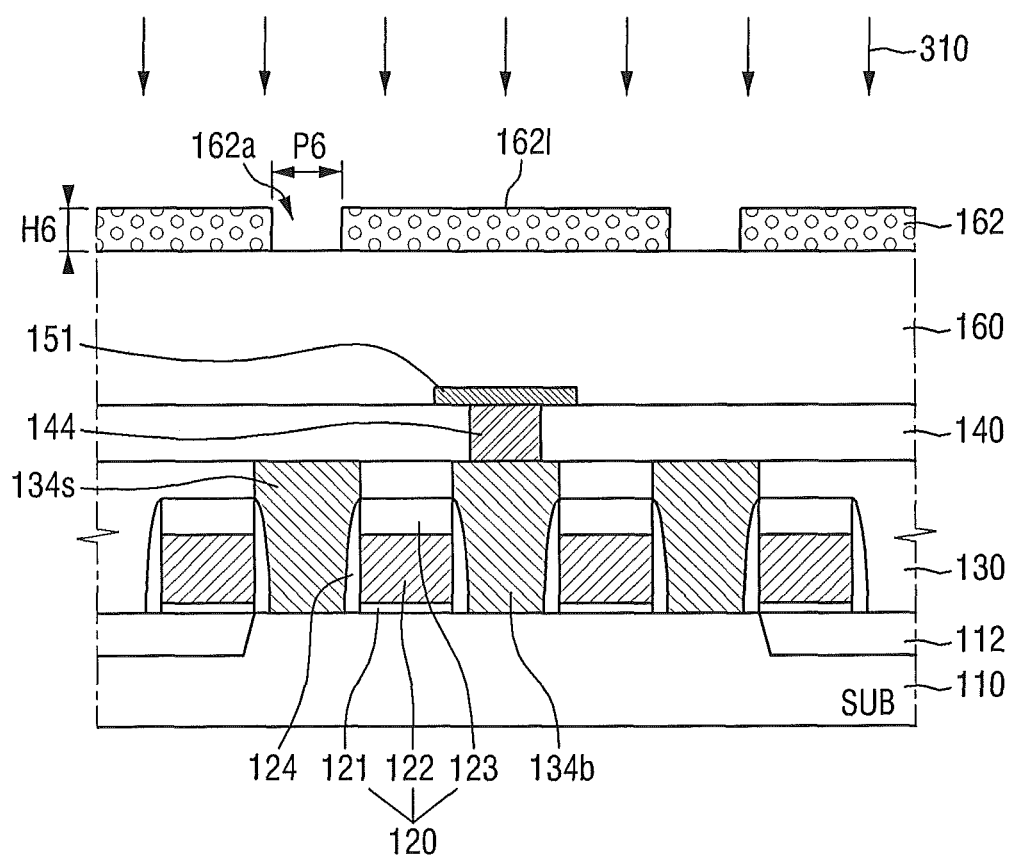

As shown in FIG. 22, a sixth mask pattern 162 may be formed on the third interlayer insulating film 160 as described above with respect to the formation of a second mask pattern 220 on an etch-target film 210, a hard mask film 215 or the first interlayer insulating film 130. Thus, in some exemplary embodiments, the sixth mask pattern 162 is formed on the third interlayer insulating film 160 by implanting ions in a fifth mask pattern 161 (e.g., by using a plasma ion implantation process as described above).

The sixth mask pattern 162 may comprise any suitable pattern, including, but not limited to, patterns comprising a plurality of lines and/or a plurality of apertures. In some exemplary embodiments, the sixth mask pattern 162 comprises, consists essentially of or consists of a plurality of lines 1621 separated from each other by a sixth pitch P6. In some exemplary embodiments, the sixth mask pattern 162 comprises, consists essentially of or consists of one or more apertures 162a having a diameter equal to a sixth pitch P6 (see, e.g., FIG. 22). In some exemplary embodiments, the sixth mask pattern 162 comprises at least one pitch (e.g., P6) that is smaller than one or more of the pitches in a previous mask pattern (e.g., fifth pitch P5 of the fifth mask pattern 161). The sixth mask pattern 162 may comprise a sixth height H6.

The sixth mask pattern 162 may be used as a mask to selectively remove portions of the second interlayer insulating film 140 and/or the third interlayer insulating film 160.

Figure 23:
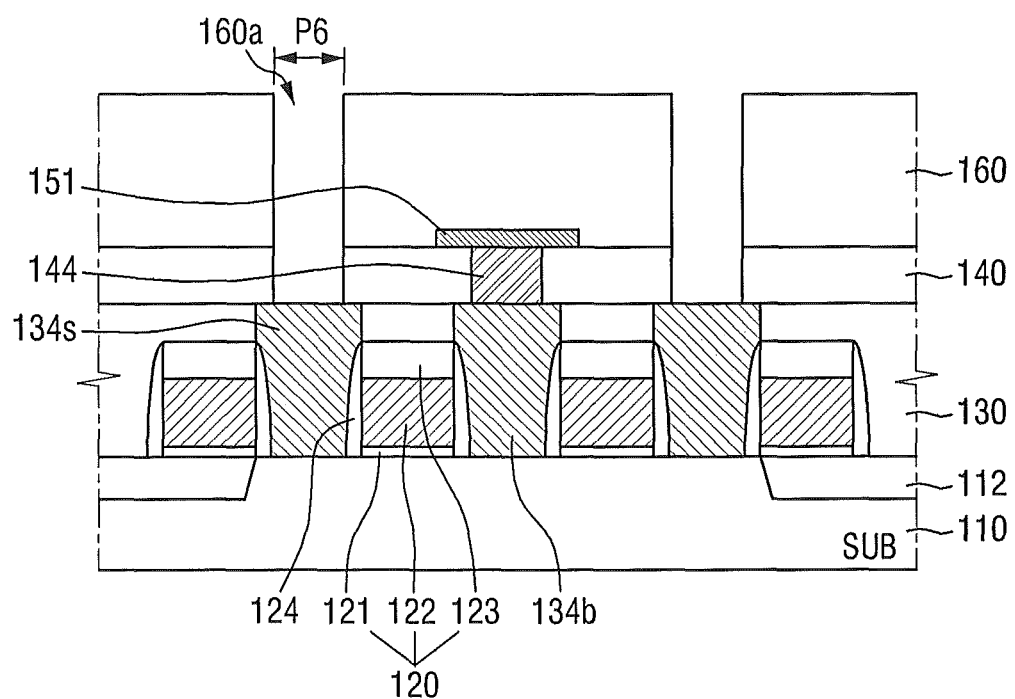

As shown in FIG. 23, in some exemplary embodiments of the inventive concept, one or more storage electrode contact holes 160a is formed in the second interlayer insulating film 140 and/or third interlayer insulating film 160 using the sixth mask pattern 162 as a mask. In some such embodiments, the diameter of each storage electrode contact holes 160a is substantially equal to the diameter of the corresponding aperture 162a in the sixth mask pattern 162 (e.g., equal to P6).

Any suitable method may be used to form the storage electrode contact holes 160a, including, but not limited to, conventional etching techniques. In some exemplary embodiments, the second interlayer insulating film 140 and third interlayer insulating film 160 are etched using a wet-etching technique. In some exemplary embodiments, the second interlayer insulating film 140 and third interlayer insulating film 160 are etched using a dry-etching technique.

The storage electrode contact holes 160a may be of any suitable depth. In some exemplary embodiments, one or more of the storage electrode contact holes 160a exposes a bit line contact pad (as shown in FIG. 23).

The sixth mask pattern 162 may be removed concurrently with and/or subsequent to formation of the storage electrode contact holes 160a.

Figure 24:
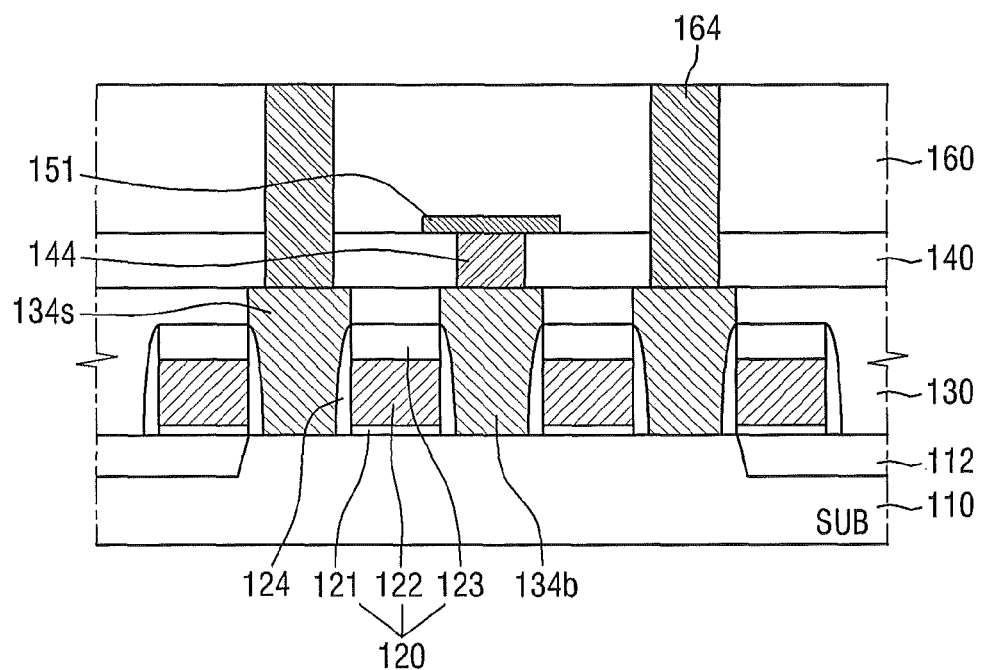

As shown in FIG. 24, in some exemplary embodiments of the inventive concept, one or more storage electrode contacts 164 is formed on the substrate 110. In some exemplary embodiments, a storage electrode contact 164 is formed in each of the storage electrode contact holes 160a.

Any suitable storage electrode contact 164 may be formed on the substrate 110. In some exemplary embodiments, one or more of the storage electrode contacts 164 comprises a conductive film.

Any suitable method may be used to form the storage electrode contact(s) 164. In some exemplary embodiments, storage electrode contacts 164 are formed by first covering the substrate 110 with a conductive film such that the conductive film fills the storage electrode contact hole(s) 160a and covers at least a portion of the upper surface of the third interlayer insulating film 160 and then removing the conductive film from the upper surface of the third interlayer insulating film 160 (e.g., by an etch-back process and/or a chemical/mechanical polishing process).

Figure 25:
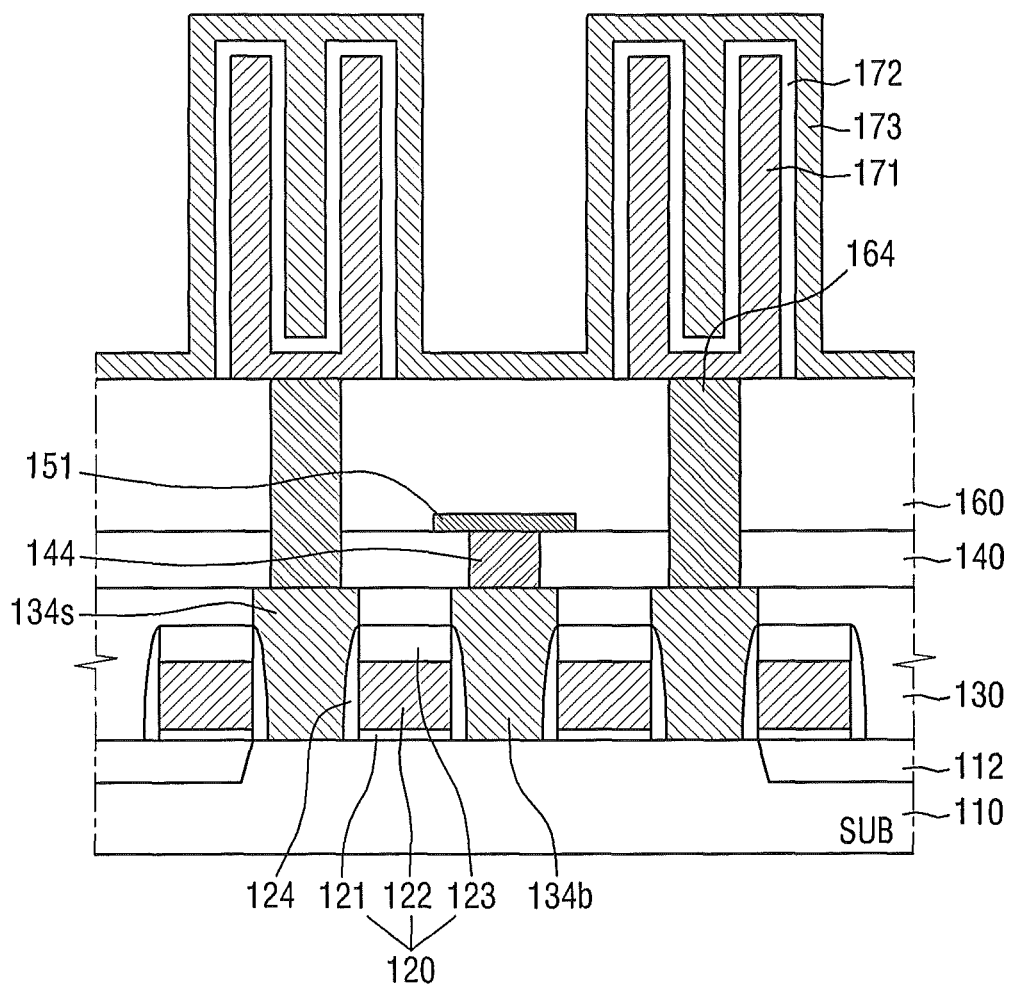

As shown in FIG. 25, in some exemplary embodiments of the inventive concept, one or more cell capacitors are formed on the substrate 110. In some exemplary embodiments, a cell capacitor is formed adjacent to each of the storage electrode contacts 164. Thus, in some exemplary embodiments of the inventive concept, the cell capacitor is connected to the storage electrode contact pads 134s via the storage electrode contacts 164.

Any suitable cell capacitor may be formed on the substrate, including, but not limited to, cell capacitors comprising, consisting essentially of or consisting of a storage electrode 171 (e.g., a storage electrode film), a dielectric element 172 (e.g., a dielectric film) and/or a plate electrode 173 (e.g., a plate electrode film). In some exemplary embodiments, one or more of the cell capacitors comprises a storage electrode 171, a dielectric element 172 and a plate electrode 173. In some exemplary embodiments, one or more of the cell capacitors comprises a storage electrode 171 having a cylindrical shape, which may facilitate increased integration density and/or capacitance.

Any suitable method may be used to form cell capacitors on the substrate 110. In some exemplary embodiments, a plurality of cell capacitors is formed on the substrate by forming a mold (e.g., a mold film) on the third interlayer insulating film 160, forming cell capacitor contact holes in the mold to expose a plurality of storage electrode contacts 164, forming a storage electrode 171 in each of the cell capacitor contact holes, removing the mold, conformably covering each storage electrode 171 with a dielectric element 172 and conformably covering the dielectric element 172 with a plate electrode 173. In some such embodiments, each storage electrode 171 comprises a conductive film and is formed in a cell capacitor contact hole by conformably covering the surface of the cell capacitor contact hole with said conductive film such that a portion of the cell capacitor contact hole remains unfilled. In some such embodiments, the unfilled portion of the cell capacitor contact hole is filled with a sacrificial oxide element (e.g., a sacrificial oxide film).

As will be appreciated by those skilled in the art, the inventive concept provides methods of forming semiconductor devices having a fine pattern. Indeed, methods of the inventive concept allow for the formation of patterns that are finer and/or more precise than patterns formed by preexisting methods. As such, methods of the inventive concept may allow for increased integration density as compared to preexisting methods.

Moreover, as will be appreciated by those skilled in the art, methods of the inventive concept may increase the efficiency with which semiconductor devices are formed by reducing the likelihood of misalignment and/or increasing the uniformity of the mask pattern(s) used in the initial stages of production.

The foregoing is illustrative of embodiments of the inventive concept and is not to be construed as limiting thereof. Although a few embodiments have been described, those skilled in the art will readily appreciate that many modifications are possible in embodiments without materially departing from the novel teachings and advantages of the inventive concept. Accordingly, all such modifications are intended to be included within the scope of this inventive concept as defined in the claims.

In the claims, any means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device, the method comprising:
   forming a first interlayer insulating film on a substrate;
   forming a first mask pattern on the first interlayer insulating film, said first mask pattern comprising a first aperture;
   implanting ions in the first mask pattern to form a second mask pattern, said second mask pattern comprising a second aperture;
   etching the first interlayer insulating film using the second mask pattern as a mask, thereby forming a contact hole in the first interlayer insulating film; and
   forming a contact pad in the contact hole,
   wherein the diameter of the first aperture is larger than the diameter of the second aperture,
   wherein the first aperture comprises at least one sidewall that is neither vertical nor substantially vertical,
   wherein each sidewall of the second aperture is vertical or substantially vertical, and
   wherein the second aperture is derived from the first aperture.

2. The method of claim 1, wherein the second aperture is derived from the first aperture by implanting ions in the first mask pattern at a negative or positive angle of incidence with respect to a vertical axis of the substrate.

3. The method of claim 1, wherein implanting ions in the first mask pattern comprises a plasma ion implantation process.

4. The method of claim 3, wherein a source gas used in the plasma ion implantation process comprises at least one gases selected from the group consisting of argon (Ar), arsenic (As), boron (B), carbon (C), fluorine (F), germanium (Ge), helium (He), neon (Ne), nitrogen (N), phosphorus (P), silicon (Si) and xenon (Xe).

5. The method of claim 1, wherein implanting ions in the first mask pattern comprises implanting ions in the first mask pattern at a negative or positive angle of incidence with respect to a vertical axis of the substrate.

6. The method of claim 1, wherein implanting ions in the first mask pattern comprises a first ion implantation process and a second ion implantation process, said first and second ion implantation processes utilizing different angles of incidence with respect to a vertical axis of the substrate.

7. The method of claim 1, further comprising forming a bit line contact on the contact pad.

8. The method of claim 7, wherein forming the bit line contact comprises:
- forming a second interlayer insulating film on the first interlayer insulating film;
- forming a third mask pattern on the second interlayer insulating film;
- implanting ions in the third mask pattern to form a fourth mask pattern;
- etching the second interlayer insulating film using the fourth mask pattern as a mask, thereby forming a bit line contact hole in the second interlayer insulating film; and
- forming a bit line contact in the bit line contact hole in the second interlayer insulating film.

9. The method of claim 1, further comprising forming a storage electrode contact on the contact pad.

10. The method of claim 9, wherein forming the storage electrode contact comprises:
- forming a second interlayer insulating film on the first interlayer insulating film;
- forming a third mask pattern on the second interlayer insulating film;
- implanting ions in the third mask pattern to form a fourth mask pattern;
- etching the second interlayer insulating film using the fourth mask pattern as a mask, thereby forming a bit line contact hole in the second interlayer insulating film;
- forming a bit line contact in the bit line contact hole in the second interlayer insulating film;
- forming a third interlayer insulating film on the second interlayer insulating film;
- forming a fifth mask pattern on the third interlayer insulating film;
- implanting ions in the fifth mask pattern to form a sixth mask pattern;
- etching the second interlayer insulating film and the third interlayer insulating film using the sixth mask pattern as a mask, thereby forming a storage electrode contact hole in the second interlayer insulating film and the third interlayer insulating film; and
- forming a storage electrode in the storage electrode contact hole in the second interlayer insulating film and third interlayer insulating film.

\* \* \* \* \*